United States Patent [19]

Sugawara

[11] 4,454,453
[45] Jun. 12, 1984

[54] POWER SOURCE DEVICE FOR ION SOURCES

[75] Inventor: Toru Sugawara, Fujisawa, Japan

[73] Assignee: Tokyo Shibaura Denki Kabushiki Kaisha, Kawasaki, Japan

[21] Appl. No.: 386,529

[22] Filed: Jun. 9, 1982

[30] Foreign Application Priority Data

Jun. 17, 1981 [JP] Japan .................................. 56-92185

[51] Int. Cl.³ ....................... H05B 41/36; H01J 27/02
[52] U.S. Cl. ..................................... 315/106; 315/101;
315/111.81; 315/147; 315/175; 315/169.1;
315/98; 315/307; 315/350
[58] Field of Search ........... 315/106, 101, 147, 111.81,
315/165, 175, 169.1, 260, 98, 102, 202, 205, 307,
350, 352; 250/427

[56] References Cited

U.S. PATENT DOCUMENTS

| | | | |
|---|---|---|---|
| 3,909,663 | 9/1975 | Thomas et al. | 315/307 X |
| 3,952,228 | 4/1976 | Reader et al. | 315/169.1 X |
| 4,253,048 | 2/1981 | Osako | 315/307 |
| 4,317,983 | 3/1982 | Scheffels et al. | 315/106 X |

FOREIGN PATENT DOCUMENTS

C823767 12/1951 Fed. Rep. of Germany .

OTHER PUBLICATIONS

K. W. Ehlers et al.; "Design and Operation of an Intense Neutral Beam Source" J. Vac. Sci. Technol. 10, 922-925 (1973).
K. W. Ehlers and K. N. Leung; "Some Characteristics of Tungsten Filaments Operated as Cathodes in a Gas Discharge"; Rev. Sci. Instrum. 50, 356-361 (1979).
United Kingdom Atomic Energy Authority Research Rpt., K. J. Hill et al., "The Harwell ® Sputtered Ion Gun," Mar. 1970, p. 2, line 36; p. 3, line 8; p. 3, lines 28-32; FIG. 3.
Nuclear Instruments and Methods, vol. 38, K. J. Hill et al., "A Sputtering Ion Source," Dec. 1965; p. 15, right--hand column, line 31; p. 17, left-hand column, line 1; FIG. 3.
The Review of Scientific Instruments, vol. 30, No. 5, M. Abele et al., "Design and Performance of a Hot Cathode Magnetically Collimated Arc Discharge Ion Source," May 1959, p. 336, right-hand column, line 34; p. 337, left-hand column, line 2; p. 337, right-hand col., lines 14-25; FIG. 2.

Primary Examiner—Eugene R. LaRoche
Assistant Examiner—Vincent De Luca
Attorney, Agent, or Firm—Oblon, Fisher, Spivak, McClelland & Maier

[57] ABSTRACT

The invention provides a power source device for an ion source, including first to third power source units coupled to the anode, the cathode and the beam extraction electrode of the ion source. The second power source unit applies an alternating voltage across the cathode. An alternating heating current then flows through the cathode. Each cycle of the alternating voltage from the second power source unit has positive and negative components with preset levels which are generated with a predetermined time interval between them. The power source device further includes a control circuit for interrupting the operation of the first and third power source units during the predetermined time interval.

10 Claims, 18 Drawing Figures

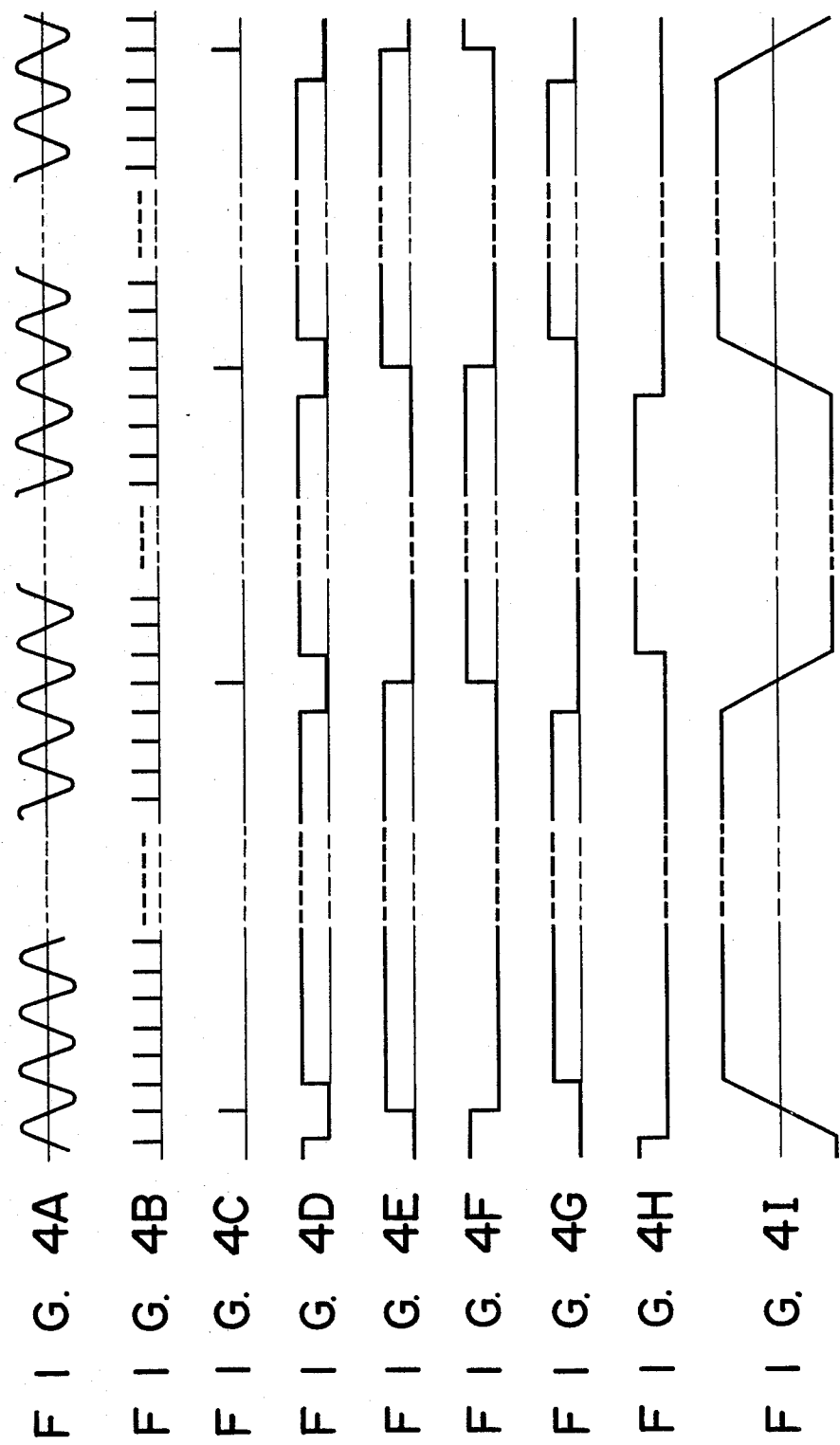

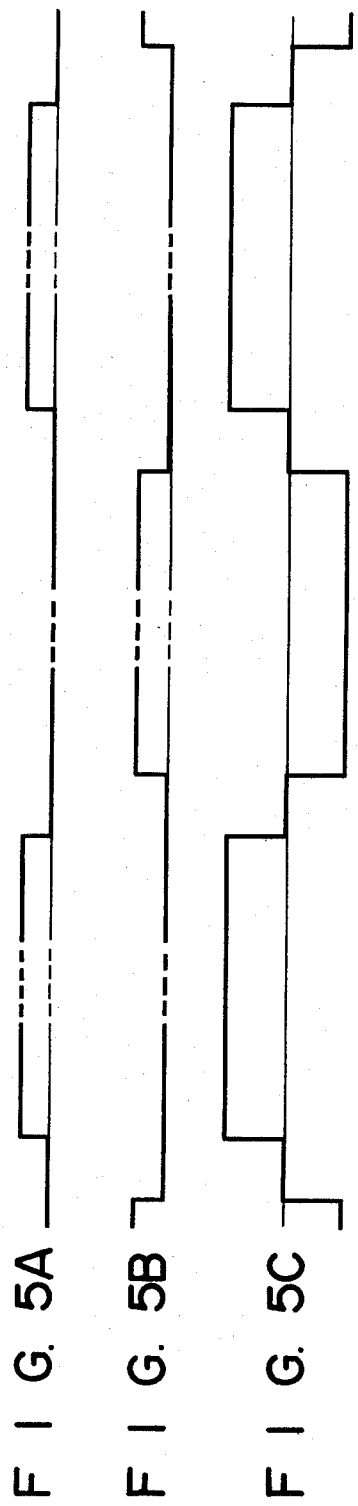
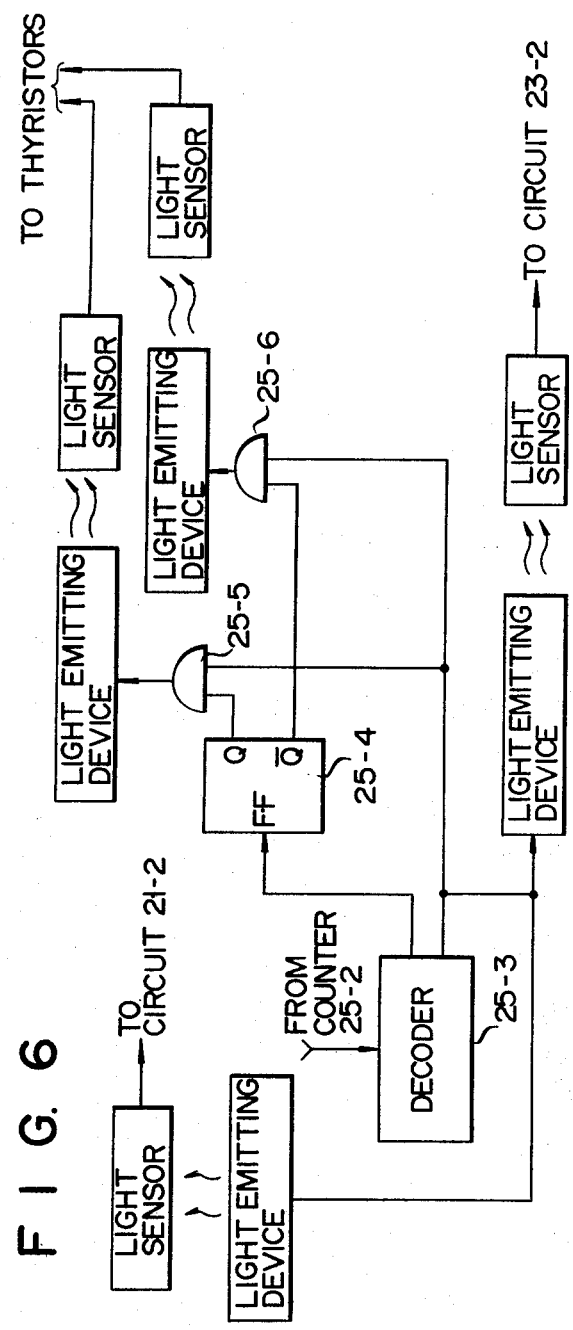

4,454,453

POWER SOURCE DEVICE FOR ION SOURCES

BACKGROUND OF THE INVENTION

The present invention relates to a power source device for ion sources including a directly heated filamentary cathode.

In an ion source of a type which has a directly heated filamentary cathode and which causes arc discharge to produce a plasma, an arc discharge current flows into the main portion of the filamentary cathode and then to a negative voltage terminal thereof. Since the arc discharge current is superposed on a heating current for heating the filamentary cathode, local overheating occurs at the vicinity of the negative voltage terminal of the cathode. The filamentary cathode then locally evaporates, resulting in a short service life of the cathode.

SUMMARY OF THE INVENTION

It is an object of the present invention to provide a power source device for ion sources wherein the local evaporation of a filamentary cathode is reduced to prolong the service life.

In order to achieve the above object of the present invention, there is provided a power source device for ion sources, comprising: first power source means adapted to cause a current to flow through anode electrode means of an ion source; second power source means for applying a voltage to beam extraction electrode means of the ion source; third power source means for applying an alternating voltage to the cathode electrode means of the ion source to cause an alternating heating current to flow through the cathode electrode means each cycle of the alternating voltage including first and second components of different constant levels and a third component of a transition time interval between the different constant levels; and controlling means for interrupting the operations of the first and second power source means during a time duration in which said third component is generated.

Since the alternating heating current is supplied to the cathode in the present invention, the cathode will not be locally overheated. Further, since the anode current and an accelerating voltage are cut off during the transition time interval, an ion beam will not be generated during this time interval.

BRIEF DESCRIPTION OF THE DRAWINGS

FIGS. 4A to 4I are timing charts for explaining the mode of operation of the power source device shown in FIG. 3;

FIGS. 5A to 5C are timing charts for explaining how a different cathode voltage is obtained in a modification of the power source device shown in FIG. 3; and FIG. 6 is a circuit diagram of part of a modification of a control circuit shown in FIG. 3.

DETAILED DESCRIPTION OF THE PREFERRED EMBODIMENT

Figure 1:
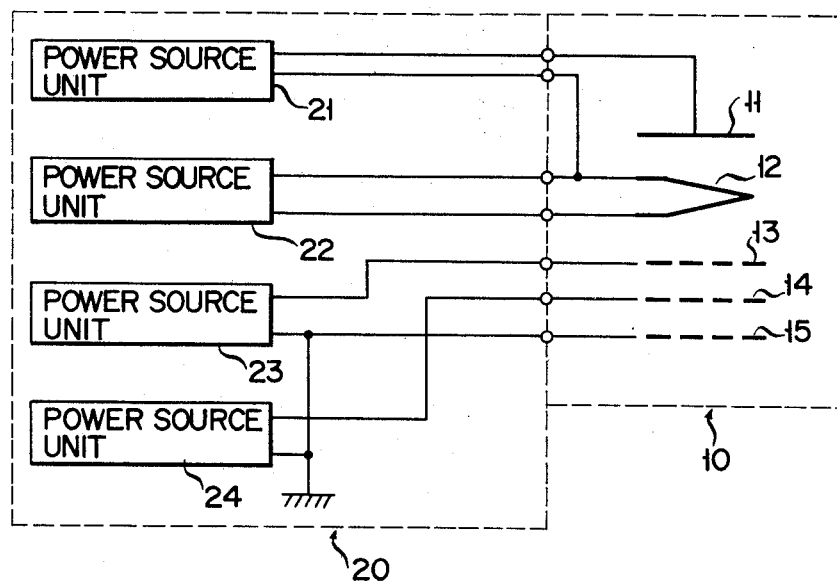
FIG. 1 shows an ion source and a power source device for driving the ion source according to one embodiment of the present invention.

FIG. 1 shows an ion source 10 and a power source device 20 which is coupled to the ion source 10 and is one embodiment according to the present invention. The ion source 10 includes a discharge anode 11, a directly heated filamentary cathode 12, an ion beam extraction electrode 13, an accelerating electrode 14 and a decelerating electrode 15. The power source device 20 includes a power source unit 21 adapted to cause a discharge current to flow to the discharge anode 11, a power source unit 22 adapted to cause a heating current to flow through the filamentary cathode 12, a power source unit 23 for applying a voltage corresponding to the desired beam energy to the ion beam extraction electrode 13, and a power source unit 24 for applying a voltage suppressing an electron backstream to the accelerating electrode 14. The decelerating electrode 15 is connected to a reference voltage terminal or a ground terminal of the power source device 20.

Figure 2A:
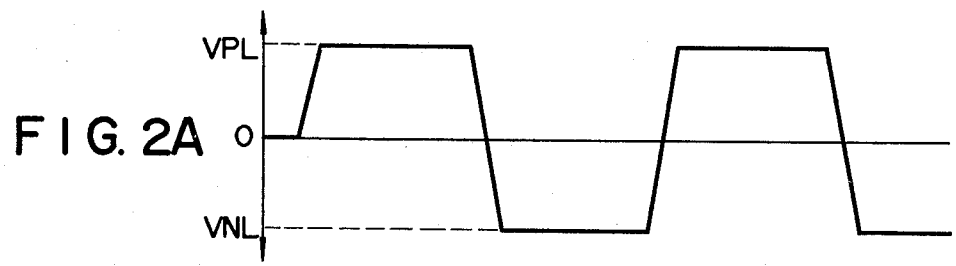
FIGS. 2A to 2C are timing charts for explaining the mode of operation of the ion source.
Figure 2B:
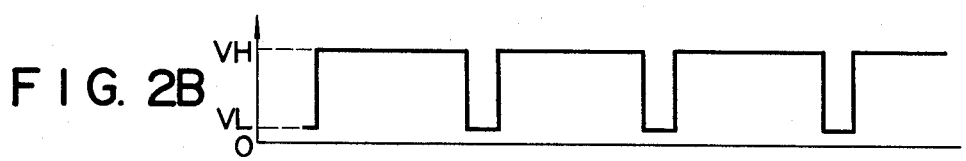
Figure 2C:
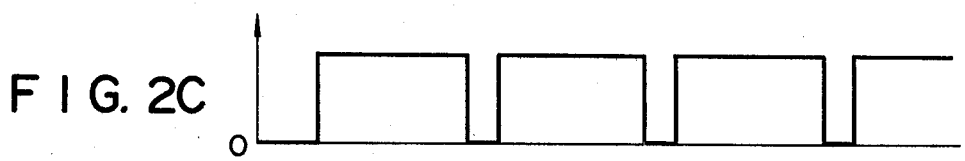

An alternating voltage of traperzoidal waveform shown in FIG. 2A is applied from the power source unit 22 to the filamentary cathode 12 of the ion source 10. The alternating heating current flows through the filamentary cathode 12. When the heating voltage of the waveform shown in FIG. 2A is set at a predetermined positive voltage level VPL, a DC heating current flows through the filamentary cathode 12 in one direction. However, when the heating voltage is set at a predetermined negative voltage level VNL, a DC heating current flows through the filamentary cathode 12 in the other direction. An anode current of the waveform shown in FIG. 2B flows from the power source unit 21 to the anode electrode 11. When the heating voltage shown in FIG. 2A is set to the positive or negative voltage level VPL or VNL, the anode current is kept at a high current level VH. During the transition period of time in which the level of the heating voltage changes from the positive voltage level VPL to the negative voltage level VNL and vice versa, the heating voltage is kept at a low current level VL. A voltage of the waveform shown in FIG. 2C is applied from the power source unit 23 to the ion beam extraction electrode 13. When the heating voltage of the waveform shown in FIG. 2A is set at the positive or negative voltage level VPL or VNL, this voltage is kept at a predetermined positive voltage level as shown in FIG. 2C. During the transition time interval between the positive and negative voltage levels VPL and VNL, the voltage (FIG. 2C) is kept at 0 V. Further, a predetermined negative voltage is applied from the power source unit 24 to the accelerating electrode 14 and the decelerating electrode 15 is kept at a voltage of 0 V.

In this embodiment, when the heating voltage of the waveform as shown in FIG. 2A is set to the positive or negative voltage level VPL or VNL, arc discharge occurs between the discharge anode 11 and the filamentary cathode 12. A plasma is then produced between the discharge anode 11 and the filamentary cathode 12. Ions are extracted by the ion beam extraction electrode 13 and accelerated by the accelerating electrode 14. However, during the transition time interval between the positive and negative voltage levels VPL and VNL, an arc current flowing through the anode 11 is minimized. The voltage of 0 V is applied to the ion beam extraction electrode 13 so that the amount of ions extracted from the plasma is minimized.

The power source units 21, 22 and 23 are synchronously controlled by a control circuit (not shown).

Figure 3:
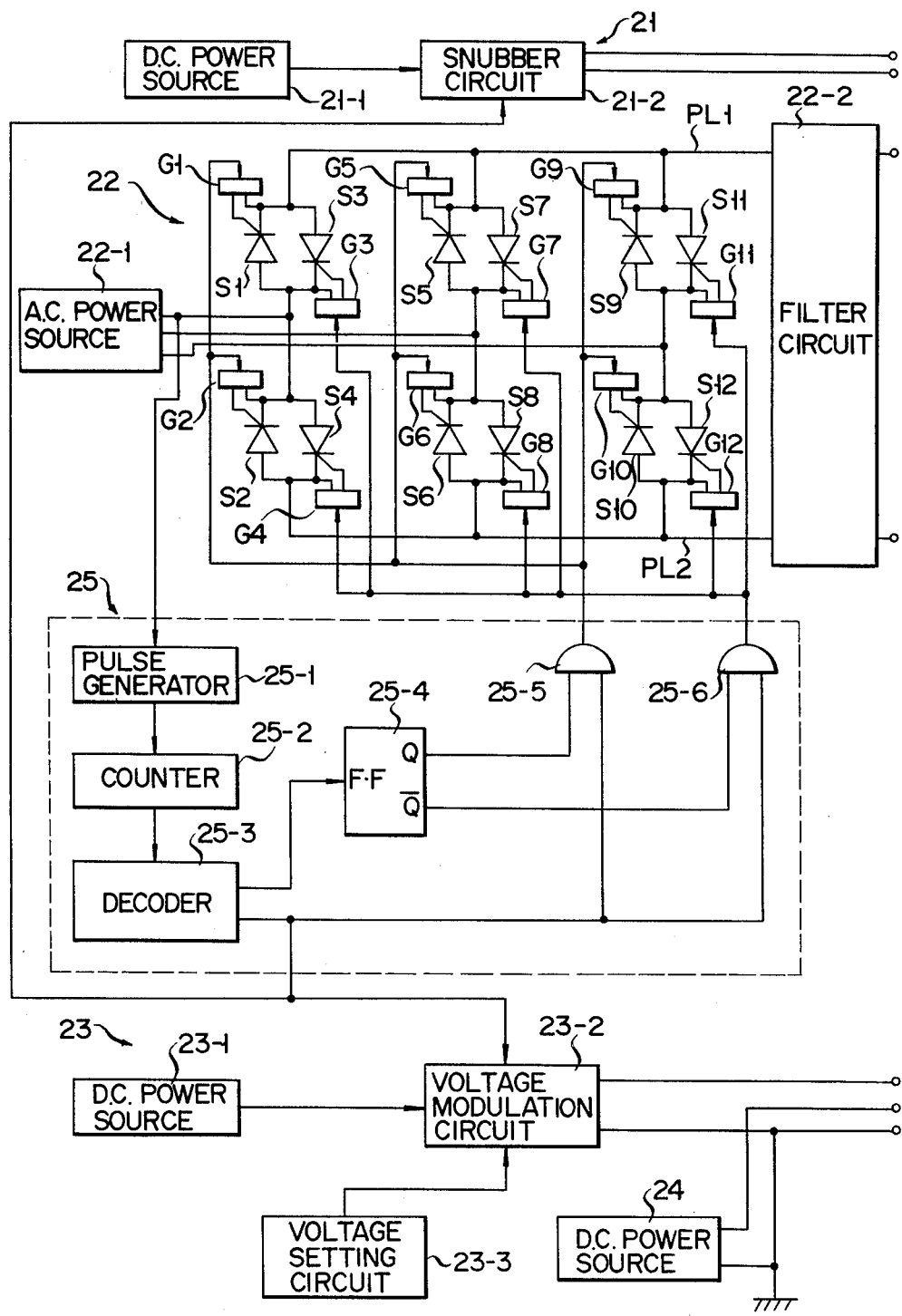
FIG. 3 is a detailed circuit diagram of the power source device shown in FIG. 1.

FIG. 3 is a detailed circuit diagram of the power source device 20. The power source unit 21 of the power source device 20 includes a DC power source 21-1 and a snubber circuit 21-2 for intermittently cutting off a current from the DC power source 21-1. The power source unit 23 includes a DC power source 23-1, a voltage modulation circuit 23-2 for stabilizing a DC voltage from the DC power source 23-1, and a voltage setting circuit 23-3 for setting the level of an output voltage from the voltage modulation circuit 23-2. Further, the power source unit 22 includes a three-phase AC power source 22-1, a rectifier circuit coupled between power source lines PL1 and PL2 and including thyristors S1 to S12 and gate circuits G1 to G12 for triggering the thyristors S1 to S12, and a filter circuit 22-2 for smoothing a current from the rectifier circuit. The thyristors S1, S5 and S9 are respectively connected in series with the thyristors S2, S6 and S10 between the power source lines PL1 and PL2. The thyristors S3, S7 and S11 are respectively connected in series with the thyristors S4, S8 and S12 between the power source lines PL1 and PL2. A first-phase output terminal of the AC power source 22-1 is connected to a junction between the thyristors S1 and S2 as well as to a junction between the thyristors S3 and S4. A second-phase output terminal is connected to a junction between the thyristors S5 and S6 as well as to a junction between the thyristors S7 and S8. A third-phase output terminal is connected to a junction between the thyristors S9 and S10 as well as to a junction between thyristors S11 and S12.

The power source device 20 further includes a control circuit 25 for synchronizing the operations of the power source units 21, 22 and 23. The control circuit 25 includes a pulse generator 25-1 which is coupled to the first-phase output terminal of the AC power source 22-1 and which generates a pulse every half cycle of the AC voltage, that is, every time the AC voltage at the first-phase output terminal reaches a reference level, and a ring counter 25-2 for counting an output pulse from the pulse generator 25-1 and generates count data and which is reset to "0" every time the count data reaches (M+N). Further, the control circuit 25 includes a decoder 25-3, a T-type flip-flop 25-4 and AND gates 25-5 and 25-6. The decoder 25-3 receives the count data from the counter 25-2. If the count value is within a range of "0" to "M−1", the decoder 25-3 generates a signal of high level. However, if the count value is within a range of "M" to "M+N−1", the decoder 25-3 generates a signal of low level from its first output terminal. Further, when the count data reaches "M+N−1", the decoder 25-3 generates a cycle pulse from its second output terminal. The output signals from the output terminals Q and $\bar{Q}$ of the flip-flop 25-4 are inverted in accordance with the cycle pulse from the decoder 25-3. One input terminal of each of the AND gates 25-5 and 25-6 is connected to the first output terminal of the decoder 25-3 and the other terminals of the AND gates 25-5 and 25-6 are respectively connected to the output terminals Q and $\bar{Q}$ of the T flip-flop 25-4. An output terminal of the AND gate 25-5 is coupled to the gate circuits G1, G2, G5, G7, G9 and G10 of the thyristors S1, S2, S5, S6, S9 and S10. An output terminal of the AND gate 25-6 is coupled to the gate circuits G3, G4, G7, G8, G11 and G12 of the thyristors S3, S4, S7, S8, S11 and S12. The output terminal of the decoder 25-3 is also coupled to the snubber circuit 21-2 as well as to a switching control terminal of the voltage modulation circuit 23-2.

The mode of operation of the power source device shown in FIG. 3 will be described hereinbelow with reference to FIGS. 4A to 4I.

In operation, an output voltage of 50 Hz with a waveform shown in FIG. 4A is generated from the first-phase output terminal of the AC power source 22-1. The pulse generator 25-1 generates a pulse signal of the waveform shown in FIG. 4B in response to an AC output voltage from the AC power source 22-1. The counter 25-2 counts the pulse signals generated from the pulse generator 25-1. Every time the count data reaches "101", for example, the cycle pulse of the waveform shown in FIG. 4C is generated from the second output terminal of the decoder 25-3. An output signal of high level is generated from the first output terminal of the decoder 25-3 when the count data of the counter 25-2 is within a range of "0" to "99". However, an output signal of low level is generated from the first output terminal of the decoder 25-3 when the count data is within a range of "100" and "101", as shown in FIG. 4D. Signals with waveforms shown in FIGS. 4E and 4F, respectively, are generated from the output terminals Q and $\bar{Q}$ of the T-type flip-flop 25-4 in response to the cycle pulse with the waveform shown in FIG. 4C. Control signals with the waveforms respectively shown in FIGS. 4G and 4H are generated from the AND gates 25-5 and 25-6. Each cycle signal component of the output signal from the AND gates 25-5 and 25-6 is set to high level during a time interval corresponding to 100 pulses. The cycle signal component is then set to low level over a time interval corresponding to 104 pulses. The output signals from the AND gates 25-5 and 25-6 are out of phase for a phase angle corresponding to a time interval of 102 pulses.

When the output signal of high level is generated by the AND gate 25-5, a full-wave rectifier circuit constituted by the thyristors S1, S2, S5, S6, S9 and S10 is activated. A three-phase alternating voltage from the AC power source 22-1 is rectified and the power source lines PL1 and PL2 serve as the positive and negative power source lines, respectively. The heating current flows from the power source line PL1 to the power source line PL2 through the cathode 12 (FIG. 1). Thereafter, when the output signals from the AND gates 25-5 and 25-6 are set to a low level, all the thyristors S1 to S12 are turned off. A voltage across the power source lines PL1 and PL2 is gradually decreased as shown in FIG. 4I. When the output signal of high level is then generated from the AND gate 25-6, a full-wave rectifier circuit constituted by the thyristors S3, S4, S7, S8, S11 and S12 is activated. A three-phase alter-nating voltage from the AC power source 22-1 is rectified, and at this time, the power source lines PL1 and PL2 act as the negative and positive power source terminals, respectively. A voltage of the opposite polarity is induced across the power source lines PL1 and PL2. The heating current flows from the power source line PL2 to the power source line PL1 through the cathode 12.

The snubber circuit 21-2 and the voltage modulation circuit 23-2 are controlled by an output signal of the decoder 25-3 having the waveform shown in FIG. 4D. When the output signal from the first output terminal of the decoder 25-3 is set to a high level, the snubber circuit 21-2 causes the anode current of high level to flow to the anode 11 and the voltage modulation circuit 23-2 causes the accelerating voltage of high level set by the voltage setting circuit 23-3 to flow to the ion beam extraction electrode 13. However, when the output signal from the first output terminal of the decoder 25-3 is set at a low level, the snubber circuit 21-2 interrupts the anode current and the voltage modulation circuit 23-2 prevents the DC power source 23-1 from applying the voltage to the ion beam extraction electrode 13.

As described above, in the embodiment as shown in FIGS. 1 to 3, the power source unit 22 causes the alternating heating current to flow to the cathode 12 of the ion source 10, preventing local overheating of the cathode 12. Thus, the service life of the cathode 12, that is, the service life of the ion source 10 can be prolonged. The power source units 21 and 23 interrupts the anode current and the accelerating voltage during the transition time interval, thus preventing generation of ion beams in the transition period of time.

Although the present invention has been described with reference to one embodiment, the present invention is not limited to this particular embodiment. For example, the power source unit 22 may be arranged to generate the heating voltage with the waveform shown in FIG. 5C in response to the output signals (corresponding to the output signals of the AND gates shown in FIG. 4G and 4H) of the AND gates shown in FIGS. 5A and 5B. In summary, any waveform may be utilized for the heating voltage only if the high and low voltage components and a voltage level transferring component connecting the high and low voltage components during the transition time interval are included.

The control signal from the control circuit 25 is transmitted through lead wires to the power source units 21, 22, and 23. However, as shown in FIG. 6, the control signal from the decoder 25-3 may be converted to an optical signal. After this optical signal is converted to an electrical signal again, the signal may be supplied to the snubber circuit 21-2 and the voltage modulation circuit 23-2. Similarly, the output signals from the AND gates 25-5 and 25-6 may be converted to optical signals. These optical signals may be converted to electrical signals again and may be applied to the gate circuits of the thyristors.

What is claimed is:

1. A power source device for ion sources including anode electrode means, beam extraction electrode means and cathode electrode means arranged between the anode and beam extraction electrode means, comprising:
   first power source means adapted to cause a current to flow through said anode electrode means,
   second power source means adapted to supply a beam acceleration voltage to said beam extraction electrode means,
   third power source means adapted to apply an alternating voltage across said cathode electrode means, causing an alternating heating current to flow through said cathode electrode means, each cycle of said alternating voltage including first and second components having preset different levels and generated with a predetermined time interval from each other, and
   control means generating a control signal to interrupt the operations of said first and second power source means during said predetermined time interval.

2. A power source device according to claim 1, wherein said third power source means includes a three-phase AC power source, a three-phase rectifier circuit for rectifying an output voltage from said three-phase AC power source in one direction in a first operation mode and for rectifying the output voltage from said three-phase AC power source in the other direction in a second operation mode, and a filter circuit coupled to said three-phase rectifier circuit.

3. A power source device according to claim 2, wherein said control means generates first and second control signals for alternately setting the first and second operation modes with an interval therebetween, in response to the output voltage from said three-phase AC power source.

4. A power source device according to claim 3, wherein said three-phase rectifier circuit has a first three-phase full wave rectifier formed of a first group of thyristors whose conduction state is controlled by a first control signal from said control means and a second three-phase full wave rectifier formed of a second group of thyristors whose conduction state is controlled by a second control signal from said control means.

5. A power source device according to claim 3 or 4, wherein said control means generates a control signal to control said first and second power source means in response to the output voltage from said three-phase AC power source.

6. A power source device according to claim 5, wherein said first power source means has a DC power source and a snubber circuit adapted to cause an anode current corresponding to the output voltage from said DC power source to flow to said anode electrode means under the control of said control means.

7. A power source device according to claim 5, wherein said second power source means has a DC power source and a voltage modulation circuit adapted to cause a beam acceleration voltage corresponding to the output voltage from said DC power source to flow to said beam extraction electrode means under the control of the control means.

8. A power source device according to claim 1, 2, 3 or 4, wherein said first power source means has a DC power source and a snubber circuit adapted to cause an anode current corresponding to the output voltage from said DC power source to flow to said anode elec-trode means under the control of said control means.

9. A power source device according to claim 1, 2, 3 or 4, wherein said second power source means has a DC power source and a voltage modulation circuit adapted to cause a beam acceleration voltage corresponding to the output voltage from said DC power source to flow to said beam extraction electrode means under the control of said control means.

10. A power source device according to claim 1, 2, 3 or 4, wherein said beam extraction electrode means of said ion source has positive, negative and common electrodes, said positive electrode being arranged between said cathode electrode means and said negative electrode, said negative electrode being arranged between said positive and common electrodes, and said common electrode being grounded; and said second power source means has a first DC power source, a voltage modulation circuit for applying a positive control voltage corresponding to the output voltage from said DC power source to said positive electrode under the control of said control means, and a second DC power source for applying a predetermined negative DC voltage to said negative electrode.

* * * * *